United States Patent
Handa

[11] Patent Number: 6,008,675
[45] Date of Patent: Dec. 28, 1999

[54] POLARIZATION-MODE SELECTIVE SEMICONDUCTOR LASER WITH A BENDING CHANNEL STRIPE, APPARATUS INCLUDING THE SAME AND OPTICAL COMMUNICATION SYSTEM USING THE SAME

[75] Inventor: Yuichi Handa, Atsugi, Japan

[73] Assignee: Canon Kabushiki Kaisha, Tokyo, Japan

[21] Appl. No.: 08/901,288

[22] Filed: Jul. 29, 1997

[30] Foreign Application Priority Data

Jul. 31, 1996 [JP] Japan .................................. 8-217779

[51] Int. Cl.[6] ....................................................... H01S 3/08
[52] U.S. Cl. ................ 327/96; 372/45; 372/50; 372/102; 372/27
[58] Field of Search ................... 372/45, 50, 96, 372/102, 19, 27, 28

[56] References Cited

U.S. PATENT DOCUMENTS

| 5,239,410 | 8/1993 | Nishimura et al. | 359/344 |
| 5,784,399 | 7/1998 | Sun | 372/50 |
| 5,822,352 | 10/1998 | Mizutani et al. | 372/50 |
| 5,926,497 | 7/1999 | Nitta et al. | 372/96 |
| 5,946,336 | 8/1999 | Mizutani et al. | 372/50 |

FOREIGN PATENT DOCUMENTS

| 2-159781 | 6/1990 | Japan . |
| 7-235718 | 9/1995 | Japan . |

*Primary Examiner*—Hemang Sanghav
*Attorney, Agent, or Firm*—Fitzpatrick, Cella, Harper & Scinto

[57] ABSTRACT

A polarization-mode selective semiconductor laser includes a semiconductor laser structure including an active layer for generating gain spectra for the first and second different polarization modes and a diffraction grating formed with a uniform pitch over the laser structure. The laser structure includes a first DFB reflector portion with a first channel stripe and a second DFB reflector portion with a second channel stripe connected to the first stripe channel. The first DFB reflector portion and the second DFB reflector portion is serially arranged in a cavity direction of the laser. The first and second stripe channels are bent relative to each other such that a Bragg wavelength for the first polarization mode is coincident with a gain peak wavelength for the first polarization mode in the first DFB reflector portion, to make the first polarization mode dominant in the first DFB reflector portion, and that a Bragg wavelength for the second polarization mode is coincident with a gain peak wavelength for the second polarization mode in the second DFB reflector portion, to make the second polarization mode dominant in the second DFB reflector portion.

20 Claims, 12 Drawing Sheets

POLARIZATION-MODE SELECTIVE SEMICONDUCTOR LASER WITH A BENDING CHANNEL STRIPE, APPARATUS INCLUDING THE SAME AND OPTICAL COMMUNICATION SYSTEM USING THE SAME

BACKGROUND OF THE INVENTION

1. Field of the Invention

The present invention relates to a polarization-mode changeable or selective semiconductor laser whose polarization mode of output light can be changed between different polarization modes (typically, a transverse electric (TE) mode and a transverse magnetic (TM) mode) by an external control, an apparatus including the semiconductor laser, and so forth.

2. Related Background Art

Conventionally, Japanese Patent Laid-Open Application No. 2-159781 discloses an example of a distributed feedback (DFB) laser whose polarization mode of output light can be varied by an external control. In the DFB semiconductor laser, carriers are injected to perform phase adjustment and effect population inversion, and by this means the phase of internal propagating light is varied. Thus, light oscillation occurs in either the TE mode or the TM mode, whichever has a lower threshold gain in accordance with the phase condition.

In the structure of that DFB semiconductor laser, an active layer is formed of a bulk material such that the difference in gain between those different polarization modes is reduced, and the pitch of its diffraction grating is precisely set such that its Bragg wavelength is coincident with the gain peak wavelength. As a result, oscillation competition between those polarization modes can be achieved in the semiconductor laser by controlling amounts of carriers injected into its front and rear regions. In this structure, however, a desired competitive condition between those polarization modes can not be attained unless the pitch of the diffraction grating is accurately and precisely set, and hence yield of the polarization-mode selective device is likely to be undesirably low.

Further, Japanese Patent Laid-Open Application No. 7-235718 discloses another conventional device in which there are serially arranged a plurality of DFB regions whose dominant polarization modes are respectively the TE mode and the TM mode. In this structure, there is arranged an active layer (typically, a quantum well structure) which exhibits different gain spectra for the two different polarization modes, and pitches of the diffraction gratings are independently set in those TE and TM regions such that the Bragg wavelengths for those two polarization modes are respectively accorded to gain peak wavelengths for those two polarization modes in those TE and TM regions. However, its fabrication process is complicated since the different pitches are separately set in those two regions, and accordingly its yield is likely to be too low as well.

Furthermore, although the waveguide structure and the active layer may be formed differently as between the two regions to form the above-discussed TE and TM regions with the pitches of their diffraction gratings being the same, this requires more complicated epitaxial growth and processing than the above process of forming the different pitches. Thus, it is hard to obtain favorable polarization-mode switching characteristics with good reproducibility.

SUMMARY OF THE INVENTION

It is a first object of the present invention to provide a polarization-mode selective semiconductor laser structure which makes it possible to precisely and readily achieve coincident Bragg wavelengths in its different regions with peak wavelengths of respective modal gains with good reproducibility and hence improves fabrication yield of the oscillation polarization-mode selective laser.

It is a second object of the present invention to provide an optical transmitter, an optical transceiver and a light source apparatus in which there is arranged a polarization-mode selecting unit, such as a polarizer, at a light output place of an oscillation polarization-mode selective laser of the present invention such that intensity-modulated light can be supplied with a high extinction ratio.

It is a third object of the present invention to provide an optical transmission system and an optical communication method, in which an optical transmitter, an optical transceiver or a light source apparatus of the present invention is used to achieve high-quality communication or transmission, and a wavelength division multiplexing transmission system in which a wavelength-tunable characteristic of an oscillation polarization-mode selective laser of the present invention is used to achieve high-density communication or transmission.

The invention is directed to an art in which a channel waveguide structure and a diffraction grating with a uniform pitch are formed in first and second DFB regions, and the channel waveguide structure is bent at the boundary between the two DFB regions such that diffraction gratings with substantially different pitches can be respectively established in the two DFB regions even though only a diffraction grating with a uniform pitch is formed.

According to one aspect of the present invention, there is provided a polarization-mode selective semiconductor laser for selectively emitting light in either of first and second different polarization modes. The semiconductor laser includes a semiconductor laser structure having an active layer for generating gain spectra for the first and second different polarization modes, and a diffraction grating. The laser structure includes a first distributed feedback reflector portion with a first channel stripe and a second distributed feedback reflector portion with a second channel stripe connected to the first stripe channel, and the first distributed feedback reflector portion and the second distributed feedback reflector portion are serially arranged in a cavity direction of the semiconductor laser. The diffraction grating is formed with a substantially uniform pitch and a substantially uniform grating vector over the first and second distributed feedback reflector portions. The first and second stripe channels are bent relative to each other so as to make the first polarization mode dominant in the first distributed feedback reflector portion and make the second polarization mode dominant in the second distributed feedback reflector portion.

When a cavity of a laser is constructed by using a diffraction grating, loss is minimum at the Bragg wavelength of the diffraction grating. On the other hand, the distribution of a gain spectrum or profile is determined by material of an active layer and the layer structure of the laser (especially, the structure of the active layer). In such a laser whose cavity is constructed using the diffraction grating, since the laser is constructed such that a certain amount of gain exists at the Bragg wavelength of the diffraction grating, values of gain and loss are close to each other at or in the vicinity of the Bragg wavelength and the laser comes to be able to oscillat when the gain exceeds the loss.

In a laser of the present invention, Bragg wavelengths of the diffraction grating in the first and second distributed feedback reflector portions can be made different from each other by bending the channel stripe. As a result, the following condition can be established in the laser of the present invention. In the first distributed feedback reflector portion, gain for the first polarization mode comes to surpass loss at the Bragg wavelength for the first polarization mode before gain for the second polarization mode comes to surpass loss at the Bragg wavelength for the second polarization mode, while in the second distributed feedback reflector portion, gain for the second polarization mode comes to surpass loss at the Bragg wavelength for the second polarization mode before gain for the first polarization mode comes to surpass loss at the Bragg wavelength for the first polarization mode. Specifically, the above condition can be readily attained by the following construction. In this construction, the Bragg wavelength for the first polarization mode is made approximately coincident with a gain peak wavelength for the first polarization mode in the first distributed feedback reflector portion, and the Bragg wavelength for the second polarization mode is made approximately coincident with a gain peak wavelength for the second polarization mode in the second distributed feedback reflector portion.

More specifically, the following constructions are possible:

The active layer is a common active layer for both the first and second distributed feedback reflector portions.

The first and second channel stripes respectively extend in the cavity direction forming different angles relative to the grating vector of the diffraction grating.

There are arranged a plurality of electrodes for injecting currents into the first and second distributed feedback reflector portions independently of each other. Hence, currents injected into the two DFB reflector portions can be flexibly controlled, and the polarization-mode modulation operation can be stably performed without fail.

The active layer is a bulk active layer or a multiple quantum well active layer. Hence, the gain peaks for the first and second polarization modes can be made sufficiently competitive, and the polarization-mode modulation operation can be stably performed without fail.

The active layer is a strained superlattice active layer to positively establish a gain competitive condition between the first and second polarization modes.

An angle formed between the first channel stripe and the grating vector of the diffraction grating is zero degree (i.e., their directions are coincident with each other), while an angle formed between the second channel stripe and the grating vector of the diffraction grating is non-zero finite degrees (i.e., their directions are different from each other).

The first and second distributed feedback reflector portions respectively have light emission end facets, and one on the other of the first and second channel stripes is formed obliquely to the light emission end facet of the distributed feedback reflector portion.

The first and second distributed feedback reflector portions respectively have light emission end facets and both the first and second channel stripes are formed obliquely to the respective light emission end facets of the first and second distributed feedback reflector portions. Due to such a structure, undesired reflection at the end facets can be effectively reduced, and the operation of the device can be stabilized.

The first and second channel stripes are connected to each other with a smoothly and continuously bending waveguide interposed therebetween.

A phase shift section or phase discontinuous section, such as a $\lambda/4$ shift section, is provided in the diffraction grating in each of the first and second distributed feedback reflector portions, so that each DFB mode can stably be a single mode.

The diffraction grating is a diffraction grating of a refractive index-coupling type, or a gain-coupling or loss-coupling type.

According to another aspect of the present invention, there is provided a light source apparatus including a polarization-mode selective semiconductor laser described above and a polarization-mode selecting unit, such as a polarizer, for selecting light in either the first or second polarization mode emitted from the semiconductor laser.

According to another aspect of the present invention, there is provided an optical transmitter including a polarization-mode selective semiconductor laser described above, a polarization-mode selecting unit, such as a polarizer, for selecting one of light in either the first or second polarization mode emitted from the semiconductor laser, and a control unit for controlling and driving the semiconductor laser such that the polarization mode of the light emitted from the semiconductor laser is changed between the first and second polarization modes in accordance with a signal input into the semiconductor laser. In the optical transmitter, the modulation electric power is small and an optical signal with a narrow width of its occupation wavelength and a large extinction ratio can be obtained.

According to another aspect of the present invention, there is provided an optical transceiver including a polarization-mode selective semiconductor laser described above, a polarization-mode selecting unit, such as a polarizer, for selecting light in the either first or second polarization mode emitted from the semiconductor laser, a control unit for controlling and driving the semiconductor laser such that the polarization mode of the light emitted from the semiconductor laser is changed between the first and second polarization modes in accordance with a signal input into the semiconductor laser, and a receiving unit for receiving a signal.

According to another aspect of the present invention, there is provided an optical communication system for communicating over a light transmission medium that transmits a signal from a transmitter side to a receiver side. The optical communication system includes a transmitter or a transceiver described above, and a receiver or transceiver described above for receiving a signal transmitted through the light transmission medium. In the communication system, an intensity-modulated signal with a small variation of output power and a small chirping can be obtained, and an ordinary and simple receiver can be used since the receiver only needs to receive the intensity-modulated signal.

According to still another aspect of the present invention, there is provided an optical communication system in which the transmitter or transceiver is constructed such that optical signals at a plurality of wavelengths can be transmitted therefrom, and a wavelength division multiplexing network is constructed. For example, there are contained a plurality of transmitters which respectively include above-discussed semiconductor lasers of the present invention and emit optical signals of different wavelengths.

According to still another aspect of the present invention, there is provided an optical communication method for communicating over a light transmission medium that transmits a signal from a transmitter side to a receiver side. In the optical communication method, a transmitter including a semiconductor laser of the present invention, a polarization-mode selecting unit for selecting light in either the first or second polarization mode emitted from the semiconductor laser and a control unit for controlling and driving the semiconductor laser such that the polarization mode of the light emitted from the semiconductor laser is changed in accordance with a signal input into the semiconductor laser is used, the transmitter is caused to transmit an optical signal whose amplitude is modulated in accordance with the signal input into the semiconductor laser, and the optical signal is transmitted through the light transmission medium toward the receiver side.

The fundamental principle of operation of the present invention will be described hereinafter. In FIG. 1, in order to describe the operation of a DFB laser of the present invention, there are schematically illustrated a uniform diffraction grating 1 with a uniform pitch $\Lambda_0$ and directions (cavity directions) of channel stripes 2 and 3 formed in two DFB regions 21 and 22 (places where the TE mode and the TM mode are respectively dominant). The relationship between the directions of the channel stripes 2 and 3 and the direction of the diffraction grating 1 is illustrated just as an example.

In the example illustrated in FIG. 1, the extension direction of the channel stripe 2 in the first DFB region 21 is the same as that of a K vector or a grating vector of the diffraction grating 1, while the direction of the channel stripe 3 in the second DFB region 22 is bent by an angle $\theta$ relative to the direction of the channel stripe 2 in the first DFB region 21. (Here, the "grating vector" has as its direction the normal to the grating lines, and a magnitude of $2\pi/\Lambda_0$.)

The setting of Bragg conditions in the respective DFB regions 21 and 22 will be considered. In order that a first polarization mode (for example, the TM mode) is made dominant in the first DFB region 21, the following condition needs to be satisfied:

$$2\beta_1 = K_1$$

where $\beta_1$ is a propagation constant of the first polarization mode and $K_1$ is the magnitude of the K vector in the first DFB region 21.

More specifically, $2N_1 = \lambda_1/\Lambda_0$ is obtained by using $K_1 = 2\pi/\Lambda_1 = 2\pi/\Lambda_0$ (the pitch of the diffraction grating 1 in the first DFB region 21: $\Lambda_1 = \Lambda_0$) and $\beta_1 = N_1 k$, where $N_1$ is an equivalent refractive index for the first polarization mode in the first DFB region 21, $\lambda_1$ is a gain peak wavelength for the first polarization mode in the first DFB region 21 (=the Bragg wavelength therefor) and k is a wave-number vector ($k = 2\pi/\lambda_1$).

Similarly, the following conditions can be obtained in the second DFB region 22 (it should be noted that the direction of the stripe channel 3 in the second DFB region 22 is bent by the angle of $\theta$):

$$2\beta_2 = K_2$$

where $\beta_2$ is a propagation constant for the second polarization mode and $K_2$ is the magnitude of the effective K vector in the second DFB region 22.

Further, $K_2 = K_1 \cdot \cos\theta = 2\pi \cdot (\cos\theta/\Lambda_0)$.

Since the grating pitch in the second region is effectively assumed to be $\Lambda_0/\cos\theta$, $2N_2 = (\lambda_2/\Lambda_0) \cdot \cos\theta$ can be finally obtained, where $N_2$ is an equivalent refractive index for the second polarization mode in the second region and $\lambda_2$ is a gain peak wavelength for the second polarization mode in the second DFB region 22.

Thus, even when the diffraction grating 1 is formed with a uniform pitch and there exist differences in the gain peak wavelength and the equivalent refractive index between the respective polarization modes, it is possible to satisfy the mode competitive condition that the gain peaks and Bragg wavelengths for the respective polarization modes can be independently made equal to each other, by bending the stripes 2 and 3 relative to each other.

FIGS. 2A and 2B respectively illustrate gain spectra and the Bragg wavelengths (indicated by arrows) for the first and second polarizations modes in the first and second regions.

The description will be made on the assumption that the first and second polarization modes are respectively TM and TE modes, for the sake of simplicity. In the first region, the Bragg wavelength for the TM mode is coincident with the gain peak for the TM mode as illustrated in FIG. 2A, and hence the TM mode is dominant in the first region. In the second region, the Bragg wavelength for the TE mode is coincident with the gain peak for the TE mode as illustrated in FIG. 2B, and hence the TE mode is dominant in the second region. In FIG. 2B, since the direction of the channel stripe 3 in the second region is bent by the angle of $\theta$ relative to the grating vector of the diffraction grating 1, the Bragg wavelengths for the TE mode and the TM mode are shifted to a longer wavelength side by $1/\cos\theta$ from those of FIG. 2A. A difference in the Bragg wavelength between the TE mode and the TM mode correspond to a difference in the propagation constant of each waveguide between the TE mode and the TM mode.

Thus, there are formed two DFB regions where the TE mode and the TM mode are respectively dominant and carriers are independently injected from each other. As a result, it is possible to create the competitive condition between oscillations in the respective polarization modes over the entire cavity only by controlling the injection of carriers into the respective DFB regions.

These advantages and others will be more readily understood in connection with the following detailed description of the preferred embodiments in conjunction with the drawings.

DESCRIPTION OF THE PREFERRED EMBODIMENTS

Embodiments having specific structures are described hereinafter.

[First Embodiment]

Figure 3:
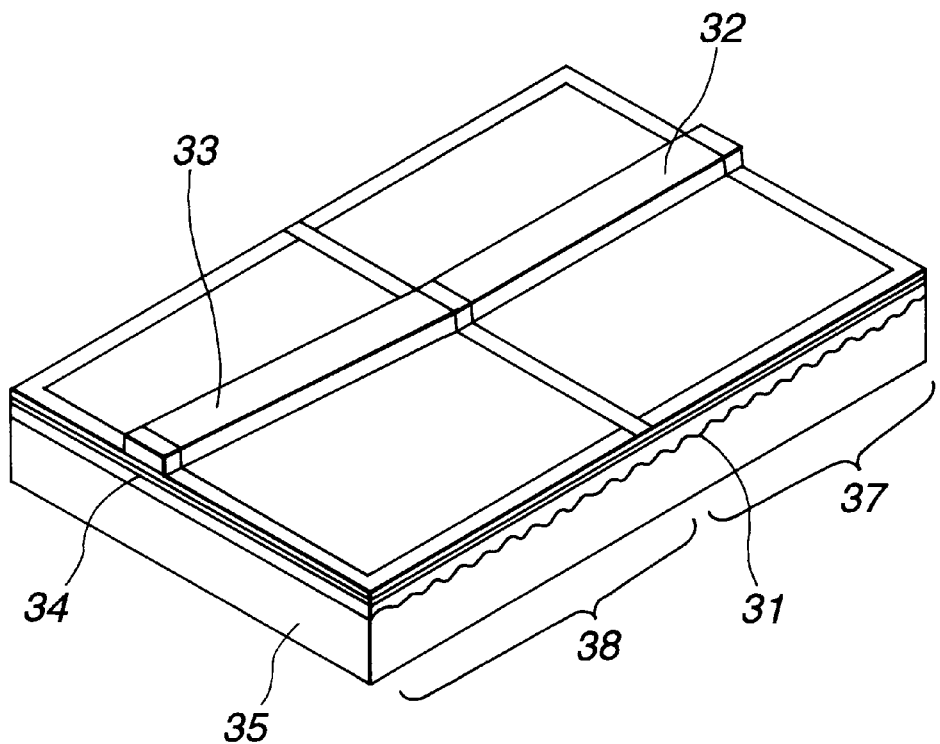
FIG. 3 is a schematic perspective view illustrating the bending distributed feedback reflector structure of a first embodiment of the present invention, which has a ridge-type laser structure and uses a multiple quantum well active layer.

FIG. 3 illustrates the schematic structure of a first embodiment of the present invention. A perspective view of a polarization-mode selective DFB semiconductor laser is illustrated. A ridge-type waveguide is employed as a typical channel stripe structure.

A diffraction grating 31 with a pitch $\Lambda_0$ is formed on an InP substrate 35, and a waveguide layer and an active layer 34 are formed on the grating 31. Ridge stripes 32 and 33 are respectively formed in right (first) and left (second) regions 37 and 38. The stripe 32 is formed parallel to the primitive grating vector of the diffraction grating 31, while the other stripe 33 is formed bent at an angle of θ relative to the primitive grating vector. The diffraction grating 31 is formed in conformity with a cleaved crystal face. The stripe 32 extends perpendicularly to a light emission end facet, while the bending stripe 33 extends at the angle θ relative to a direction perpendicular to the other light emission end facet.

Figure 4:
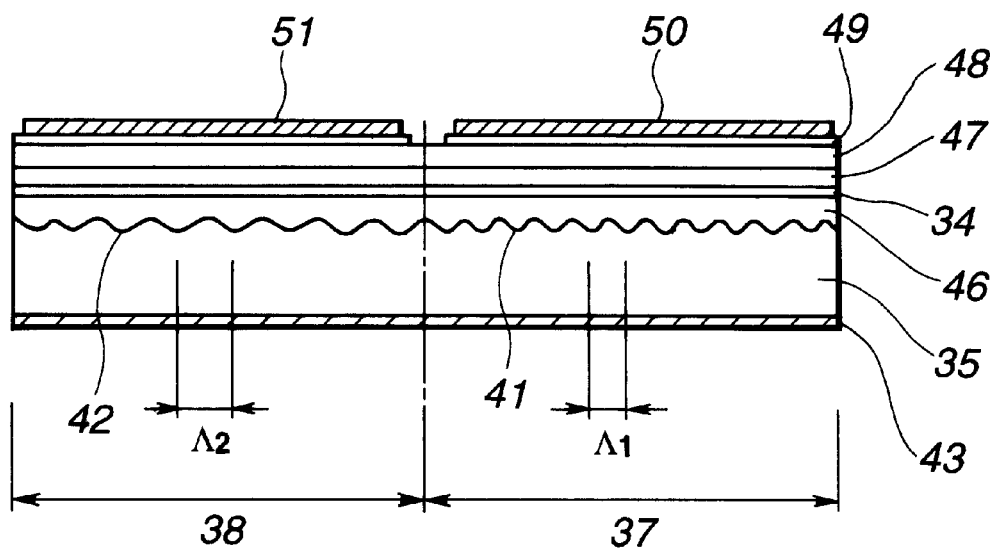
FIG. 4 is a cross-sectional view of the first embodiment taken along its bending channel stripe in the bending distributed feedback reflector structure (from section line 4—4 in FIG. 3).

FIG. 4 illustrates a cross-sectional structure taken along a direction of the bending stripes 32 and 33 of a device of the first embodiment. The cross-sections of the first and second regions 37 and 38 form the angle θ between them. As described above, a pitch $\Lambda$, of a grating 41 (this is identical with the above grating 31) in the first region 37 is equal to the pitch $\Lambda_0$, while a pitch $\Lambda_2$ of a grating 42 in the second region 38 is equal to $\Lambda_0/\cos\theta$. Thus, the equivalent pitch of the diffraction grating 42 is increased in the second region 38 and its corresponding Bragg wavelength shifts to a longer wavelength side.

The actual laser structure will be described. In FIG. 4, reference numerals 43, 50 and 51 respectively designate metal electrodes formed on the bottom surface of the substrate 35, on the first region 37 and on the second region 38. Reference numeral 46 designates an n-InGaAsP lower waveguide layer whose band-gap wavelength or band-edge wavelength is 1.3 μm. The active layer 34 is a multiple quantum well (MQW) active layer. Reference numeral 47 designates a p-InGaAsP upper waveguide layer whose band-gap wavelength or band-edge wavelength is 1.3 μm. Reference numeral 48 designates a p-InP buffer layer. Reference numeral 49 designates a p$^+$-InGaAs cap layer. The MQW active layer 34 consists of eight pairs of undoped InGaAs well layers each having a thickness of 6 nm and undoped InGaAsP barrier layers each having a thickness of 10 nm and a band-gap wavelength of 1.3 μm.

Figure 5A:
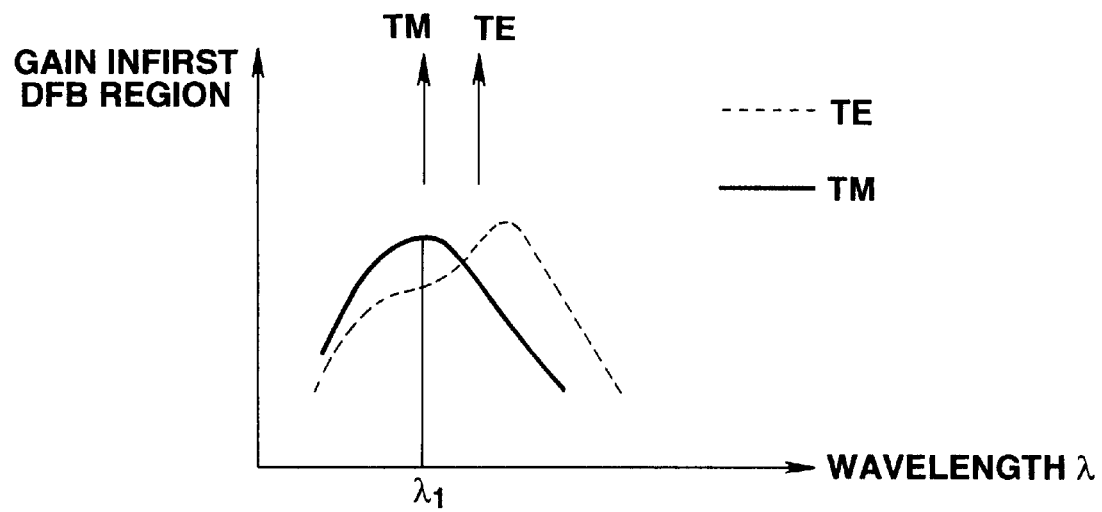
FIG. 5A is a graph illustrating the relationship between gain spectra or profiles and Bragg wavelengths $\lambda_1$ and $\lambda_2$ for the TM mode and the TE mode in a first distributed feedback reflector region of the first embodiment.
Figure 5B:
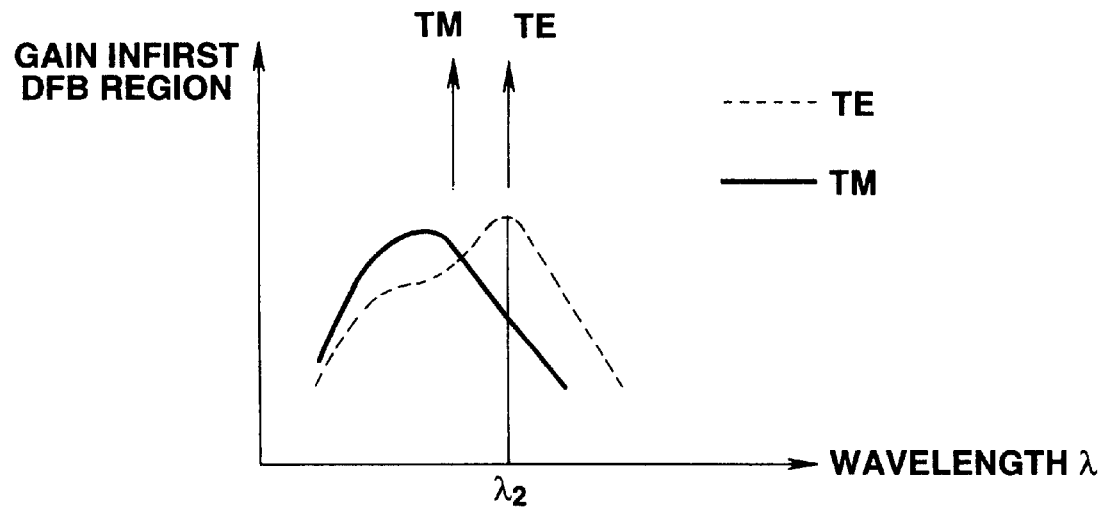
FIG. 5B is a graph illustrating the relationship between gain spectra or profiles and Bragg wavelengths $\lambda_1$ and $\lambda_2$ for the TM mode and the TE mode in a second distributed feedback reflector region of the first embodiment.

FIGS. 5A and 5B respectively illustrate gain spectra for the TM mode and the TE mode of the MQW active layer 34 and Bragg wavelengths for the TM mode and the TE mode established in the first and second regions 37 and 38. A solid line indicates the TM mode, and a dotted line indicates the TE mode. Gain peaks of those gain spectra have strong polarization-mode dependency specific to the MQW structure. The wavelength $\lambda_1$ of the TM-mode gain peak is approximately 1.56 μm and the wavelength $\lambda_2$ of the TE-mode gain peak is approximately 1.58 μm. Those gain peaks respectively correspond to transitions between ground levels of light holes and electrons and between ground levels of heavy holes and electrons. As illustrated in FIG. 5A, the TM-mode gain peak $\lambda_1$ is set equal to the TM-mode Bragg wavelength in the first region 37. As illustrated in FIG. 5B, the TE-mode gain peak $\lambda_2$ is set equal to the TE-mode Bragg wavelength in the second region 38.

In order to establish the above structure, the grating pitches $\Lambda_1$ and $\Lambda_2$ must be appropriately determined when the propagation constant of the waveguide is given. Since the equivalent refractive indices for the TM mode and the TE mode are determined from the measurement as $N_1$=3.24

(the TM mode) and $N_2=3.255$ (the TE mode), the grating pitches in the first and second regions 37 and 38 needed to equalize the Bragg wavelengths for the TM mode and the TE mode with the gain peaks $\lambda_1$ and $\lambda_2$ are given by:

$\Lambda hd\ 1 = \lambda_1/2N_1 = 0.2407\ \mu m$  (in the first region 37)

$\Lambda_2 = \lambda_2/2N_2 = 0.2427\ \mu m$  (in the second region 38)

It can be known therefrom that the grating pitch $\Lambda_2$ needed in the TE-mode region (the second region 38) is larger than the grating pitch $\Lambda_1$ needed in the TM-mode i region (the first region 37). Therefore, it can also be known that the stripe channel 33 in the TE-mode region (the second region 38) only needs to be bent by the angle of $\theta$.

When the primitive pitch $\Lambda_0 = \Lambda_1 = 0.2407\ \mu m$, the bend angle $\theta$ of the channel stripe 33 is given from the relation $\Lambda_2 \cos\theta = \Lambda_1$ and as follows:

$\theta = \cos^{-1}(\Lambda_1/\Lambda_2) = 7.36°$

From the above result, it can be seen that when the diffraction grating 31 with a uniform pitch $\Lambda_0$ of $0.2407\ \mu m$ is formed in the laser structure of the first embodiment, the TM mode is dominant in the first region 37, whose stripe channel 32 is perpendicular to the cleaved end facet, and the TE mode is dominant in the second region 38, whose stripe channel 33 is bent $\theta=7.36°$ from a direction perpendicular to the cleaved end facet.

Figure 6:
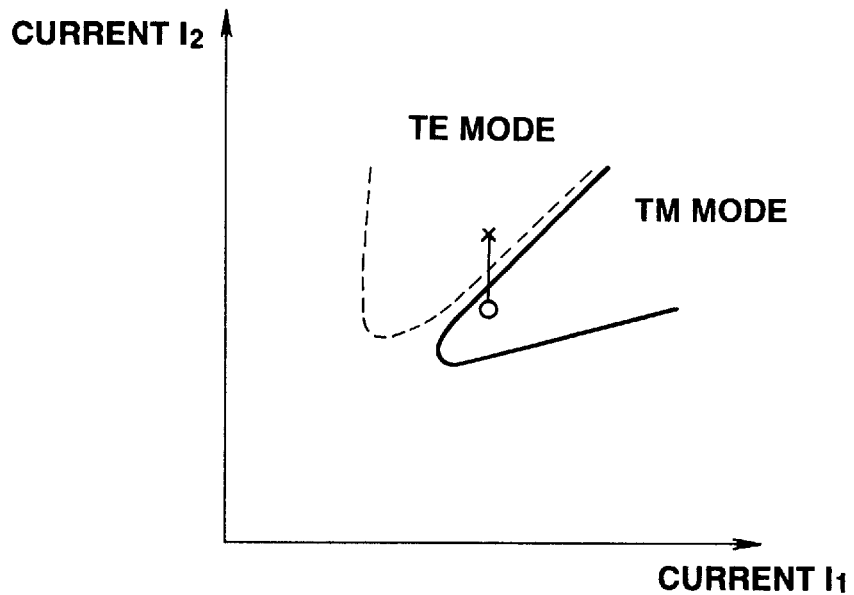
FIG. 6 is a graph illustrating the relationship between amounts of currents injected into two distributed feedback reflector regions and oscillation polarization modes, indicating separation between oscillation regions of the TE mode and the TM mode and showing bias poitns by an empty circle ○ and a cross ×, which enable the polarization-mode switching operation.

The polarization-mode switching operation of the device will be described. The relationship between the currents $I_1$ and $I_2$ injected into the two DFB regions 37 and 38 and the oscillation polarization mode is illustrated in FIG. 6 in which there are characteristic areas wherein the TE mode and the TM mode are respectively dominant. When the combination of currents ($I_1$, $I_2$) exceeding oscillation threshold values is properly selected, output in a desired poralization mode (the TE mode or the TM mode) can be obtained. For example, when the values of the currents $I_1$ and $I_2$ are set to the circle point ○ in FIG. 6, the oscillation occurs in the TM mode. In this state, when a small current is added to the current 12 injected into the second region 38, the values of the currents $I_1$ and $I_2$ are set to the cross point × in FIG. 6 and the oscillation in the TM mode turns to the oscillation in the TE mode in a moment. Thus, when the modulation current $\Delta I_2$ is superposed on the bias current $I_2$, the output signal of this device is polarization-modulated. The amplitude of the modulation current $\Delta I_2$ is below several mA whose value is equivalent to that of FSK modulation. Accordingly, a large extinction ratio can be obtained by a small modulation, and thus a highly effective modulation can be achieved. Further, since variation in carriers in the device is small during the polarization-mode switching operation, the operation can be performed with a very small chirping.

[Second Embodiment]

Figure 7:
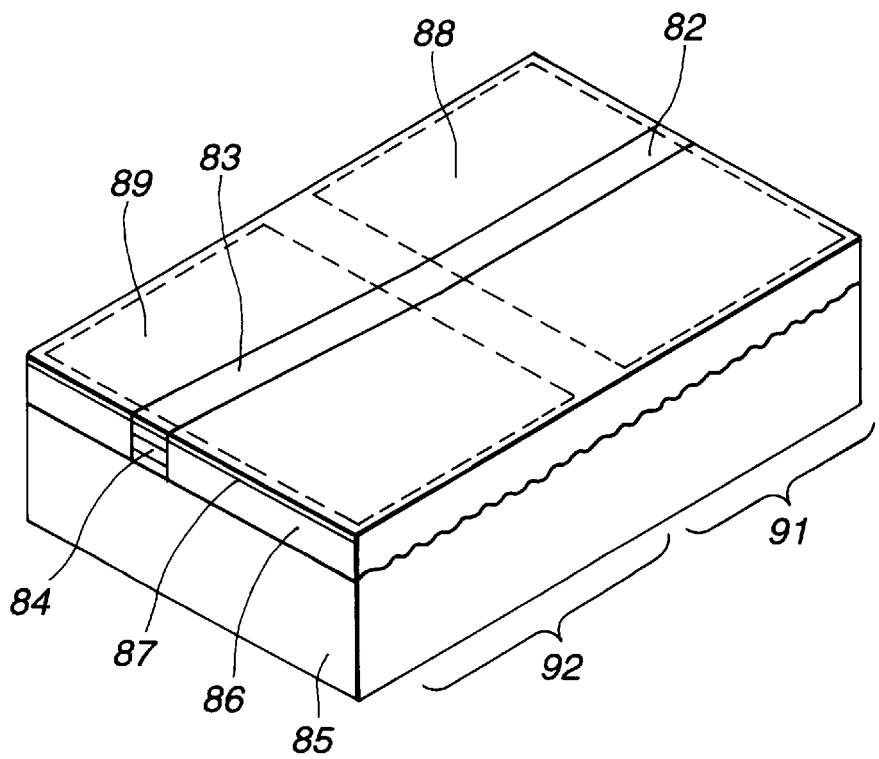
FIG. 7 is a schematic perspective view illustrating the bending distributed feedback reflector structure of a second embodiment of the present invention, which has a buried-type laser structure and uses a bulk active layer.

FIG. 7 illustrates a second embodiment of the present invention. In FIG. 7, reference numeral 85 designates an n-InP substrate. Reference numeral 82 designates a first channel stripe region having a stripe structure formed perpendicularly to a cleaved end facet. Reference numeral 83 designates a second channel stripe region having a stripe structure formed obliquely to another cleaved end facet. Reference numeral 81 designates a diffraction grating formed with a uniform pitch over the entire substrate 85. Reference numeral 84 designates an InGaAsP bulk active layer whose band-gap wavelength or band-edge wavelength is $1.55\ \mu m$. The layer structure of a guide layer, a clad layer and the like other than the active layer 84 is substantially the same as that of the first embodiment. Surroundings of the stripe portions 82 and 83 in a lateral direction are buried with undoped InP layers 86, and metal electrodes 88 and 89 are respectively provided on the stripe portions 82 and 83 with a dielectric ($SiO_2$) layer 87 being interposed therebetween. Those electrodes 88 and 89 are electrically separated from each other such that currents can be independently injected into first and second regions 91 and 92.

Figure 8A:
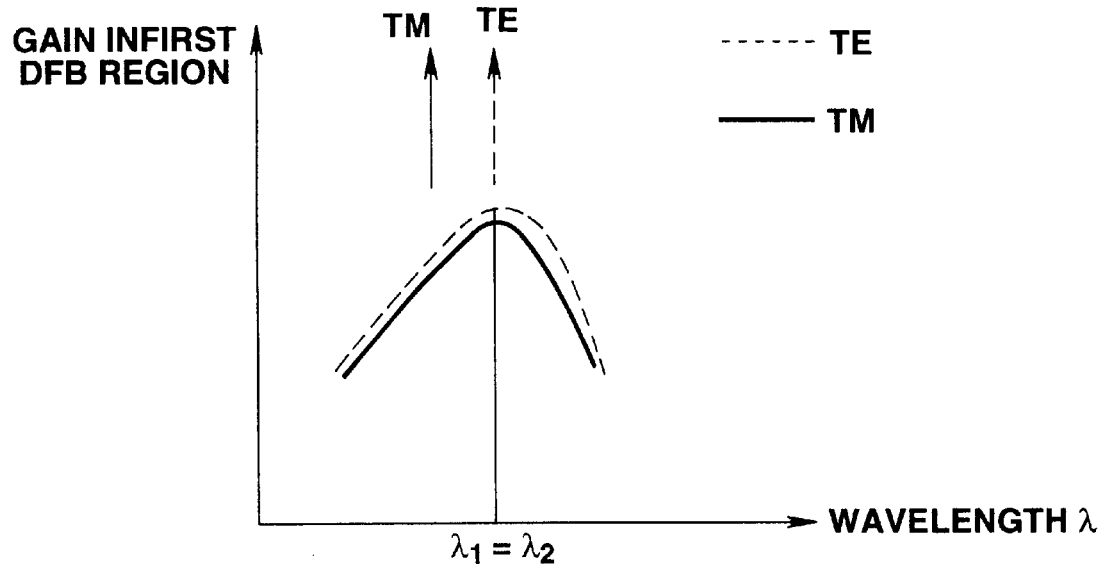
FIG. 8A is a graph illustrating the relationship between gain spectra or profiles and Bragg wavelengths $\lambda_1$ and $\lambda_2$ for the TM mode and the TE mode in a first distributed feedback reflector region of the second embodiment.
Figure 8B:
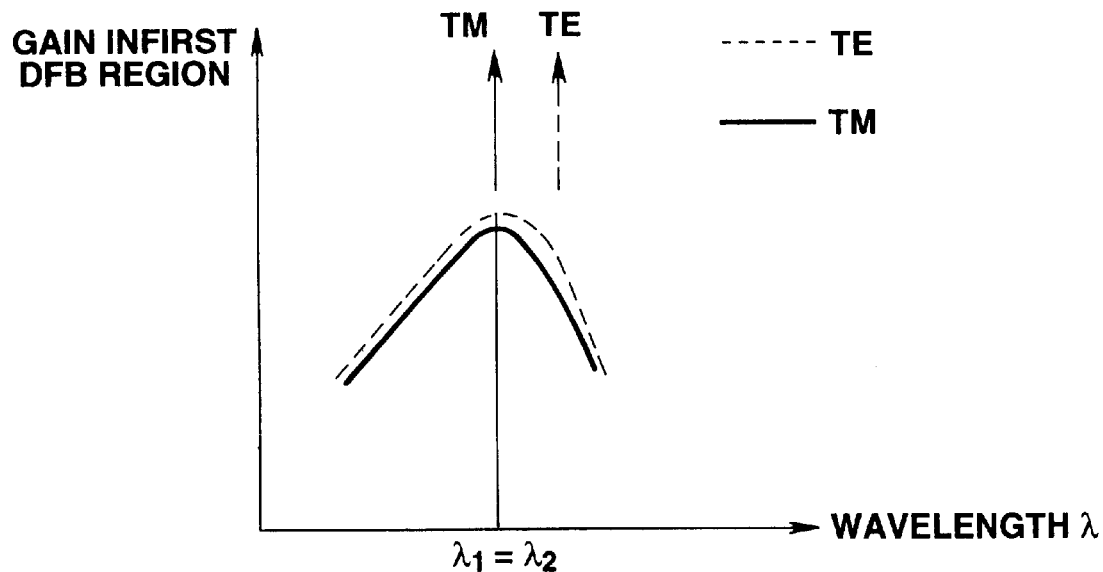
FIG. 8B is a graph illustrating the relationship between gain spectra or profiles and Bragg wavelengths $\lambda_1$ and $\lambda_2$ for the TM mode and the TE mode in a second distributed feedback reflector region of the second embodiment.

FIGS. 8A and 8B respectively illustrate gain spectra for the TM mode and the TE mode of the bulk active layer 84 and Bragg wavelengths for the TM mode and the TE mode in the first and second DFB regions 91 and 92. Since the active layer 84 has a bulk structure, only a single gain peak ($\lambda_1=\lambda_2$) of those gain spectra for the TM mode and the TE mode exists and there is substantially no gain difference between the TE mode and the TM mode. Each of gain peak wavelengths $\lambda_1$ and $\lambda_2$ is equal to $1.55\ \mu m$ ($\lambda_1=\lambda_2=1.55\ \mu m$).

When $N_1=3.255$ (the TE mode) and $N_2=3.24$ (the TM mode) are used as equivalent refractive indices for the TE mode and the TM mode (those values are determined from materials of the active layer 84 and so forth), the grating pitches for the respective polarization modes needed to equalize the Bragg wavelengths for the TM mode and the TE mode with the gain peaks $\lambda_1$ and $\lambda_2$ ($\lambda_1=\lambda_2=1.55\ \mu m$) are given by:

$\Lambda_1=0.2381\ \mu m$  (the TE mode)

$\Lambda_2=0.2392\ \mu m$  (the TM mode)

It can be known therefrom that the grating pitch $\Lambda_1$ needed in the TE-mode region 91 is smaller than the grating pitch $\Lambda_2$ needed in the TM-mode region 92 and the TM-mode region 92 should correspond to an obliquely-formed second region.

The bend angle $\theta$ of the stripe 83 in the second region 92 is given from the relation $\Lambda_2\cos\theta = \Lambda_1$ and is as follows:

$\theta=\cos^{-1}(\Lambda_1/\Lambda_2)=5.50°$

The operation and so forth of this embodiment are the same as those of the first embodiment.

[Third Embodiment]

In a third embodiment, a strained quantum well structure is used as an active layer. The fundamental structure of this embodiment is the same as the above embodiment illustrated in FIG. 4 or 7, so illustration of the device structure of the third embodiment is omitted.

As the active layer, a superlattice, in which gains for the TE mode and the TM mode are equalized with each other and into which a tensile strain is introduced, is used. Specifically, this MQW active layer consists of five pairs of tensile-strained (1%) InGaAs well layers each having a thickness of 6 nm and InGaAsP barrier layers each having a thickness of 10 nm and a band-gap wavelength of $1.3\ \mu m$. Peaks of gain spectra for the TE mode and the TM mode of the active layer are approximately equalized by the introduction of strain thereinto. The gain peak wavelength is set to $\lambda_1=\lambda_2=1.55\ \mu m$.

Regarding the equivalent refractive indices for the TE mode and the TM mode which are determined by characteristics of the light guide layer, values thereof are set to the same values as those of the second embodiment because there is polarization-mode dispersion in the waveguide structure. It becomes possible therefrom that the Bragg wavelength for the TE mode is equalized with the gain peak wavelength for the TE mode in the first stripe region formed perpendicularly to a cleaved end facet and that the Bragg wavelength for the TM mode is equalized with the gain peak wavelength for the TM mode in the second stripe region formed obliquely to the other cleaved end facet. Its bend angle θ is set to 5.50°. The operation and so forth of this embodiment are the same as those of the first embodiment.

[Fourth Embodiment]

Figure 1:
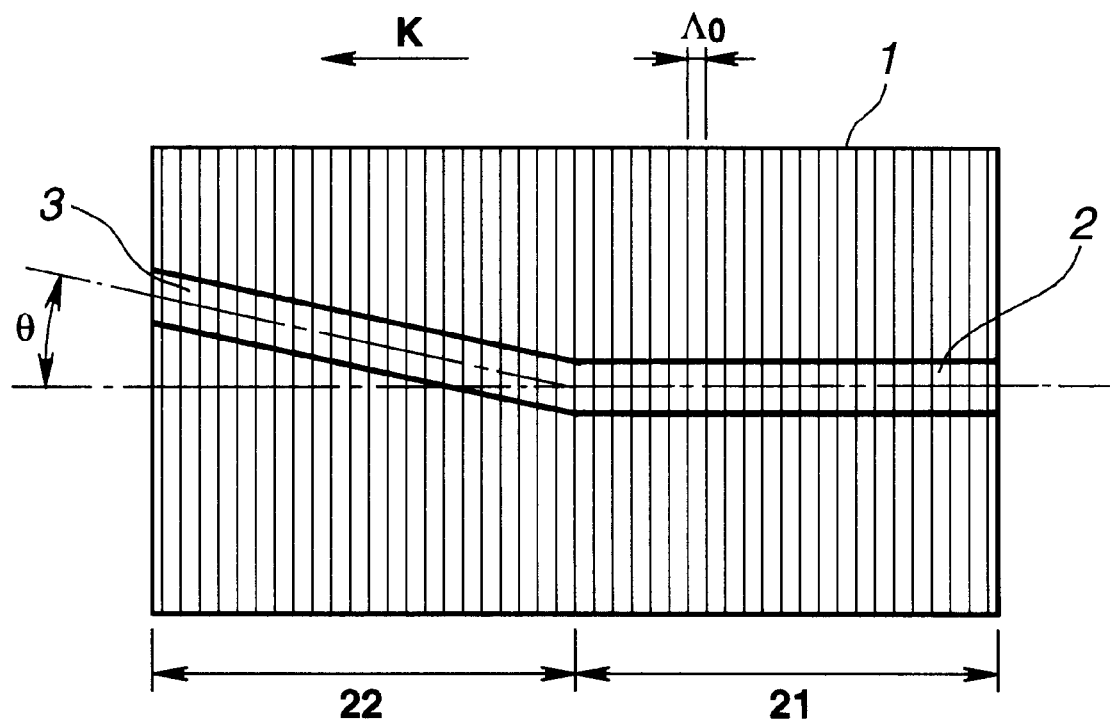
FIG. 1 is a schematic plan view illustrating the structure of a bending distributed feedback reflector for explaining the fundamental operation principle of the present invention.
Figure 9:
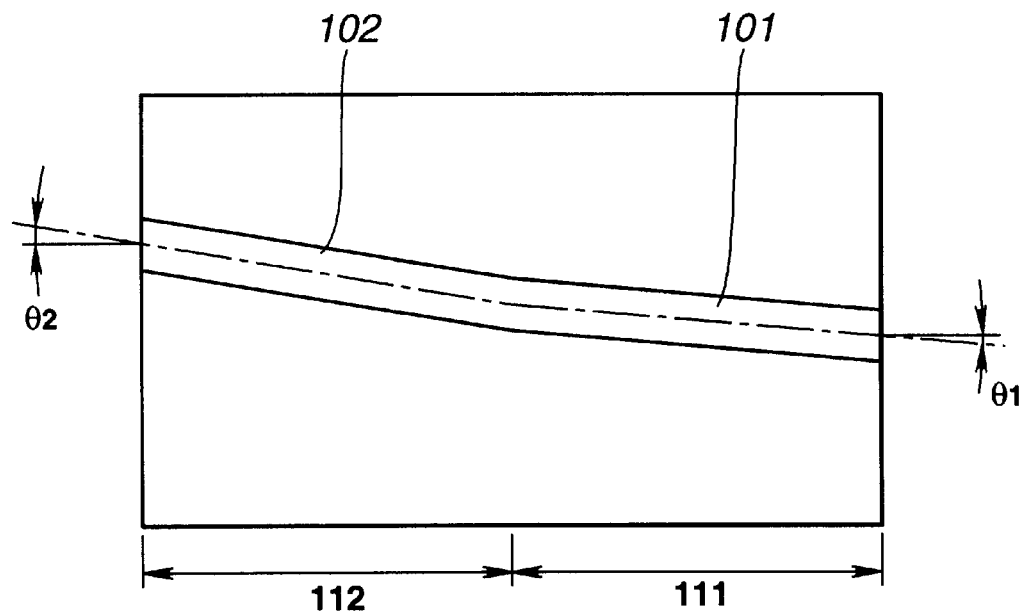
FIG. 9 is a schematic plan view illustrating the structure of a bending distributed feedback reflector of a fourth embodiment of the present invention, in which two stripe channels in two distributed feedback reflector regions are both formed obliquely to a grating vector at different angles.

In the above embodiments, the channel stripe structure in the first region is formed perpendicularly to the cleaved end facet and only the channel stripe structure in the second region is formed obliquely to the other cleaved end facet. In the fourth embodiment, channel stripes in both of first and second regions are formed obliquely to respective cleaved end facets. FIG. 9 illustrates the fourth embodiment. First and second channel stripes 101 and 102 in first and second regions 111 and 112 are respectively formed being bent by angles of $\theta_1$ and $\theta_2$ from normals to cleaved end facets. A diffraction grating is formed in conformity with the cleaved end facet of crystal, as illustrated in FIG. 1.

When the bulk active layer used in the second embodiment is used in this embodiment, the grating pitches for the TE mode and the TM mode need to be $\Lambda_1=0.2381$ μm and $\Lambda_2=0.2392$ μm. Those pitches are given by $\Lambda_1=\Lambda_0/\cos\theta_1$ and $\Lambda_2=\Lambda_0/\cos\theta_2$ where $\Lambda_0$ is the primitive pitch of the diffraction grating. That is, $\Lambda_1/\Lambda_2=\cos\theta_2/\cos\theta_1$. Here, when one bend angle $\theta_1$ is determined, another bend angle $\theta_2$ can be determined therefrom.

When $\theta_1=3°$, $\theta_2=\cos^{-1}(\Lambda_1/\Lambda_2 \cdot \cos\theta_1)=6.26°$.

Since the channel stripes 101 and 102 are formed obliquely to the both end facets, undesired reflection at the end facets can be effectively reduced and the operation of the device can be stabilized. The operation and so forth of this embodiment are otherwise the same as those of the first embodiment.

[Fifth Embodiment]

Figure 10:
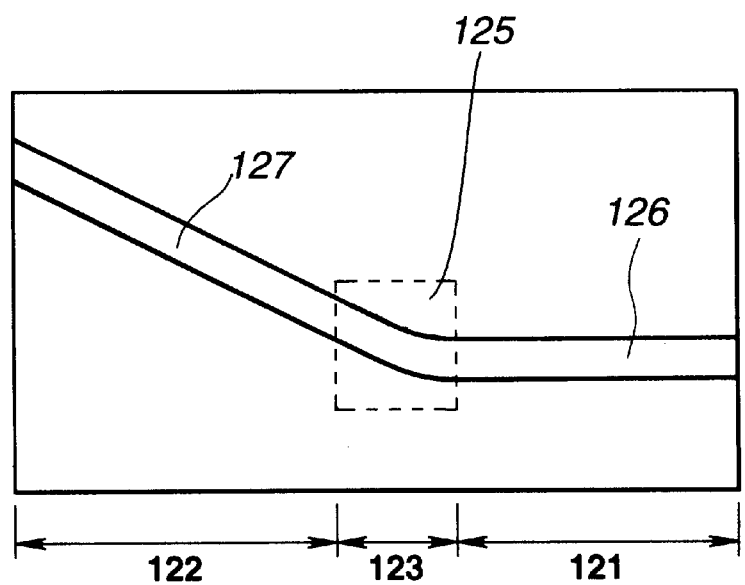
FIG. 10 is a schematic plan view illustrating the structure of a bending distributed feedback reflector of a fifth embodiment of the present invention, in which two stripe channels in two distributed feedback reflector regions are connected to each other via a transition region which consists of a smoothly and continuously bending waveguide.

FIG. 10 illustrates a device of a fifth embodiment of the present invention. In this embodiment, channel stripes 126 and 127 in first and second regions 121 and 122 are connected using a bending waveguide 125 which is curved smoothly and continuously, so that loss occurring due to the bending of the waveguide is reduced at the connection portion 125 between the two channel stripes 126 and 127. This structure is an effective structure where the bend angle θ between the two channel stripes 126 and 127 is large. In other respects, the operation and so forth of this embodiment are the same as those of the first embodiment.

[Sixth Embodiment]

Figure 11:
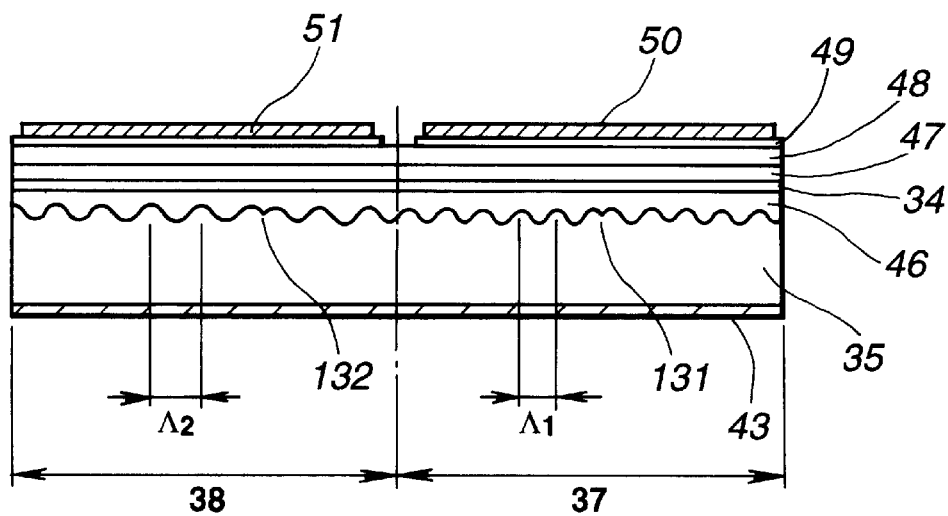
FIG. 11 is a cross-sectional view of a sixth embodiment which has a $\lambda/4$ shift section in each DFB reflector region, taken along its bending channel stripe of the distributed feedback reflector structure extending in a cavity direction.

FIG. 11 is a cross-sectional view similar to FIG. 4, which illustrates a device of a sixth embodiment of the present invention. Layer structures along the bending channel stripe of this embodiment are shown in FIG. 11. There exists a difference between pitches $\Lambda_1$ and $\Lambda_2$ of the gratings in right-side (first) and left-side (second) regions since the channel stripe is bent at a central portion of the device.

While the grating has a uniform pitch over the entire device of each embodiment discussed above, phase shift sections 131 and 132 are respectively formed in the firts and second regions 37 and 38 in this embodiment. Those phase shift sections 131 and 132 effectively operate in order to cause each polarization mode to oscillate in a unique DFB mode in each region 37 and 38. That is, the Bragg wavelength corresponding to each region 37 and 38 can be uniquely determined.

As illustrated in FIG. 11, there are provided λ/4 shift sections 131 and 132, at ech of which the phase of the grating is inverted, in central portions of the respective regions 37 and 38, so that the competing polarization mode can be obtained in a single DFB mode. The desposition of the λ/4 shift section in each region enables a stable polarization modulation operation to be attained over a wide operation range.

In FIG. 11, the same reference numerals as those in FIG. 4 denote portions having the same functions. Other aspects of the operation and so forth of this embodiment are the same as those of the first embodiment.

[Seventh Embodiment]

Figure 12:
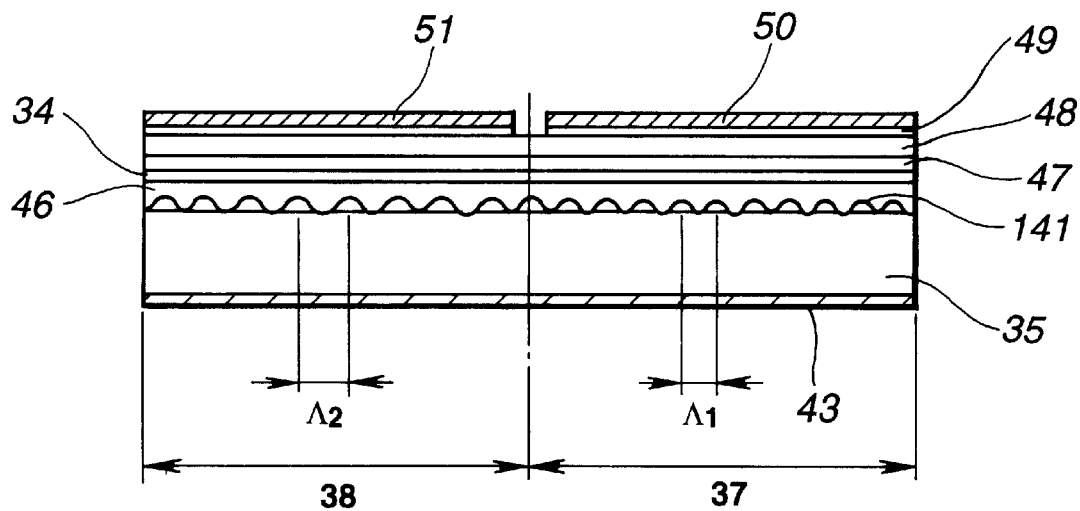
FIG. 12 is a cross-sectional view of a seventh embodiment which includes a gain-coupling type DFB structure, taken along its bending channel stripe of the distributed feedback reflector structure extending in a cavity direction.

FIG. 12 illustrates a cross section of a seventh embodiment along the device's cavity direction. In this embodiment, an InGaAs absorbing layer 141 is contained in the diffraction grating to construct a diffraction grating of a gain-coupling (or loss-coupling) type in which a stable mode can be established in each region 37 and 38. In contrast, the diffraction grating of a refractive index-coupling type is used in the above embodiments. To construct the gain-coupling type, a diffraction grating is formed after the InGaAs absorption layer 141 is epitaxially grown, and the lower guide layer 46 and the active layer 34 are laid down on the diffraction grating with the InGaAs absorption layer 141 being periodically left. A specific layer structure of this embodiment is substantially the same as that of the above embodiment (see FIG. 4).

Since the DFB structure of the gain-coupling type is thus formed, the DFB mode in each polarization mode can be stabilized and a stable polarization-mode modulation operation can be achieved even during a current-injection operation over a wide range for wavelength tuning and the like.

In FIG. 12, the same reference numerals as those in FIG. 4 denote portions having the same functions. Otherwise, the operation and so forth of this embodiment are also the same as those of the first embodiment.

[Eighth Embodiment]

Figure 13:
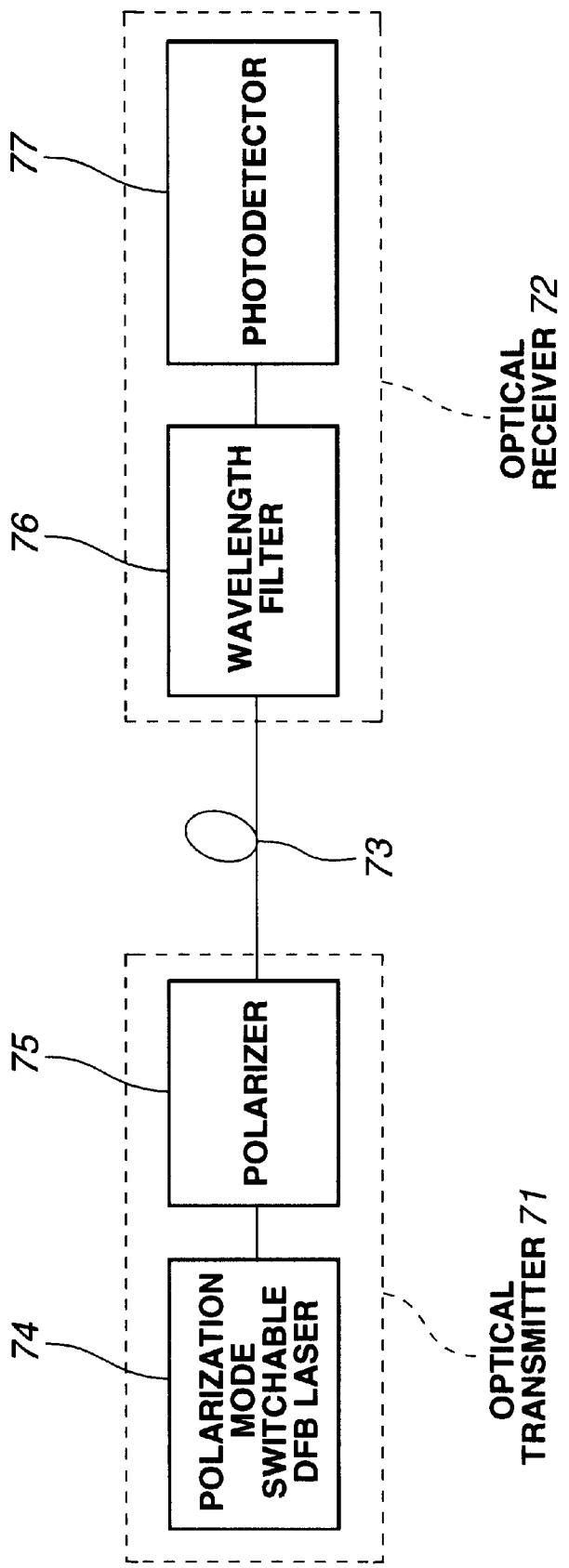
FIG. 13 is a block diagram of an optical transmission system using a polarization-mode selective semiconductor laser of the present invention.

FIG. 13 illustrates a block diagram of optical transmission. A signal sent from an optical transmitter 71 is transmitted through an optical fiber 73, and is detected by an optical receiver 72. In a wavelength division multiplexing system, a wavelength filter 76 is arranged before a photodetector 77 when needed. In the transmission system, a polarization-mode switchable DFB laser 74 of the present invention is polarization-modulated according to a signal to be transmitted, and only one polarization mode of the polarization-modulated output from the DFB laser 74 is selected by using a polarizer 75. Thus, an ASK signal (amplitude-modulated signal) with a large extinction ratio and small chirping can be readily obtained. Due to its small dynamic wavelength variation or chirping, this device can be used also in high-density wavelength division multiplexing systems.

[Ninth Embodiment]

Figure 14:
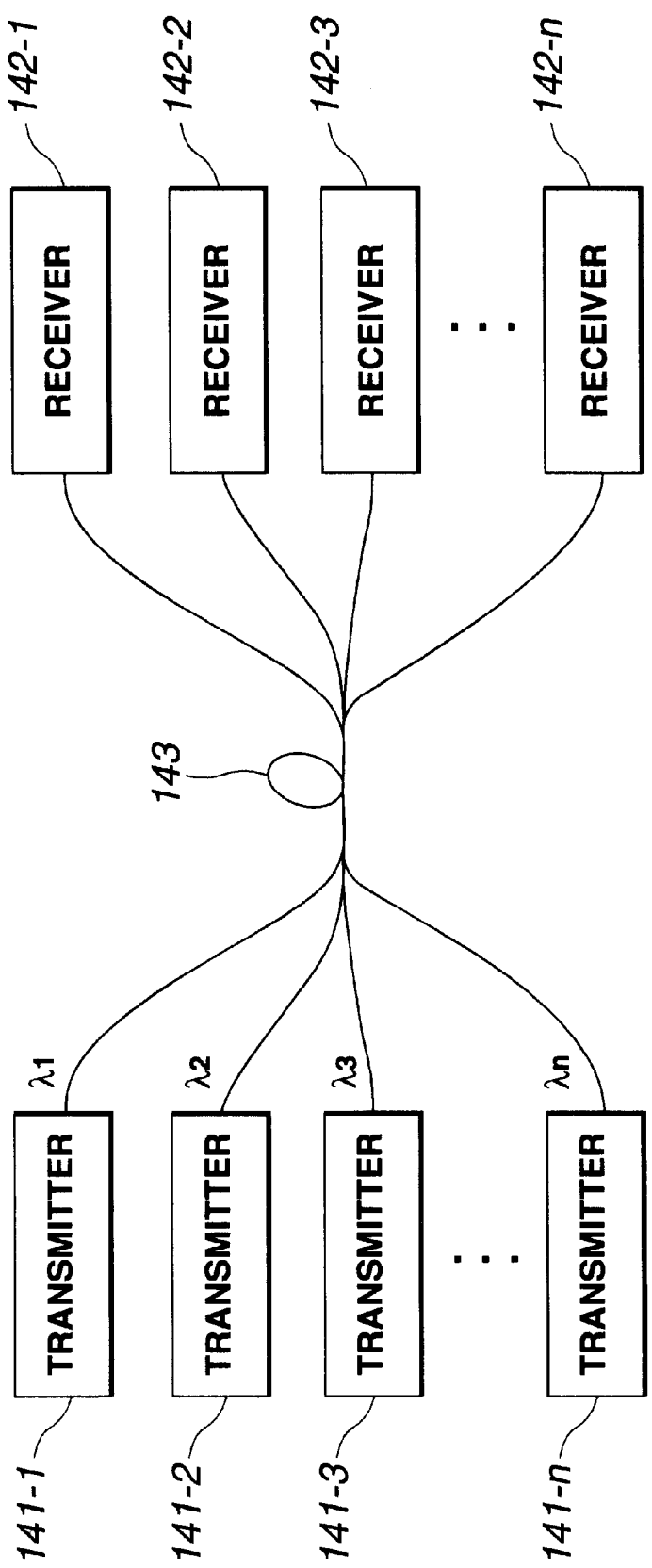
FIG. 14 is a block diagram of a wavelength division multiplexing optical transmission system of a star-type topology using a polarization-mode selective semiconductor laser of the present invention.

FIG. 14 illustrates a wavelength multiplexing communication system of a star type in which a polarization-mode switchable semiconductor laser device of the present invention is used.

In FIG. 14, reference numerals 141-1 through 141-n respectively denote transmitters each including a polarization-mode switchable DFB semiconductor laser of the present invention and a polarizer, and reference numerals 142-1 through 142-n respectively denote receivers each including a wavelength filter and a photodetector. Each of the transmitters and the receivers has the construction described above referring to FIG. 13, and wavelength multiplexing is executed in this embodiment.

To change the output wavelength of the polarization-mode switchable laser of the present invention, currents injected through respective electrodes are controlled similarly to the wavelength tuning control in an ordinary multi-electrode DFB laser diode. In this embodiment, ten-wavelength multiplexing is carried out by the multiplexed transmitters 141-1 through 141-10 whose oscillation wavelengths are arranged at intervals of 1 Å.

As the wavelength filter in the receiver, a waveguide-type filter of a DFB type is used corresponding to the wavelength multiplexing such that the wavelength multiplexing with low crosstalk can be attained. A filter device of a fiber Fabry-Perot type can also be used as the wavelength filter.

[Tenth Embodiment]

Figure 15:
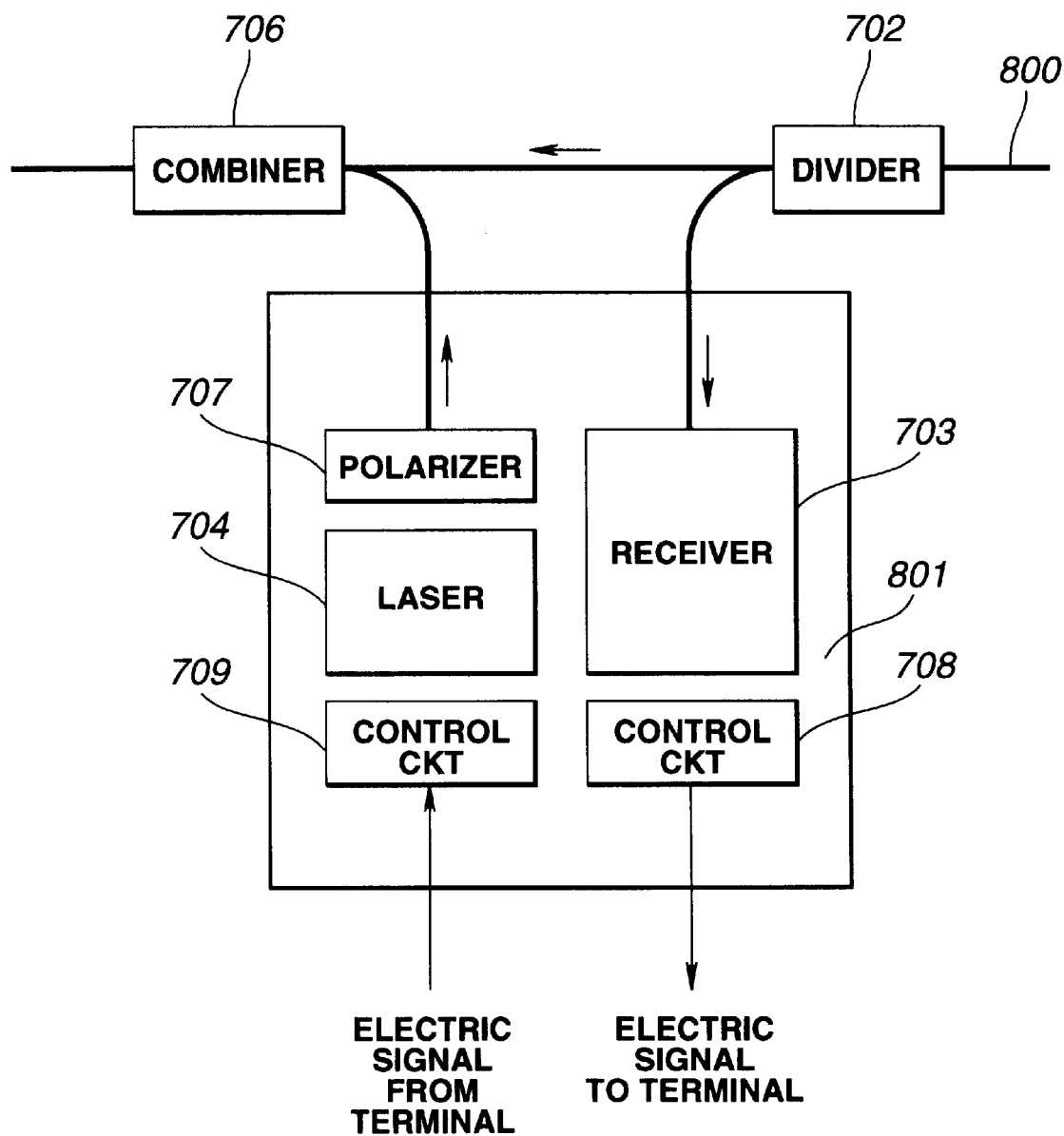
FIG. 15 is a block diagram illustrating the structure of a node (a transceiver) used in an optical transmission system.

A tenth embodiment will be described with reference to FIGS. 16 and 17. The tenth embodiment is directed to an optical local area network (LAN) system using an optical communication system of the present invention. FIG. 15 illustrates an opto-electric converting unit (node), which is connected to a terminal of the optical LAN system shown in FIG. 16 or 17.

Figure 16:
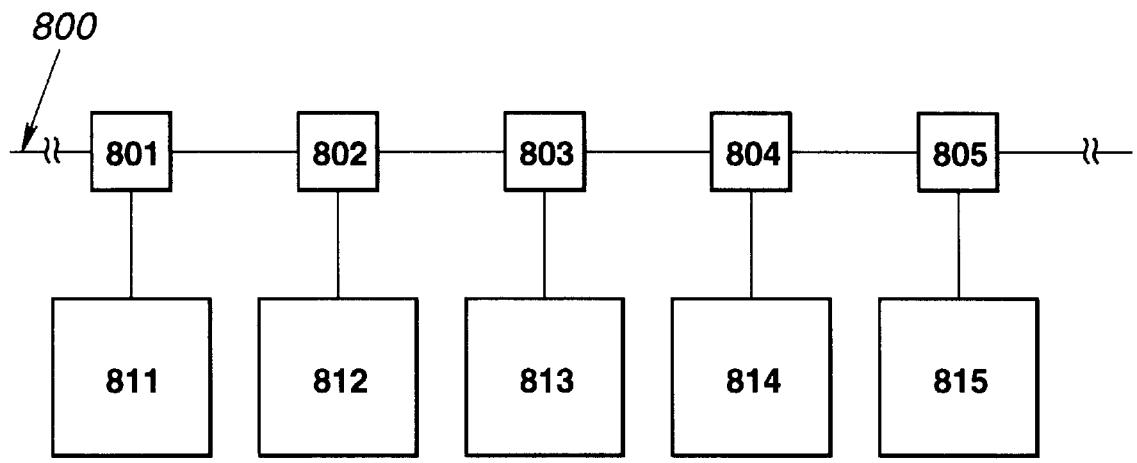
FIG. 16 is a schematic block diagram illustrating the structure of a bus-type optical LAN system using a polarization-mode selective semiconductor laser of the present invention.
Figure 17:
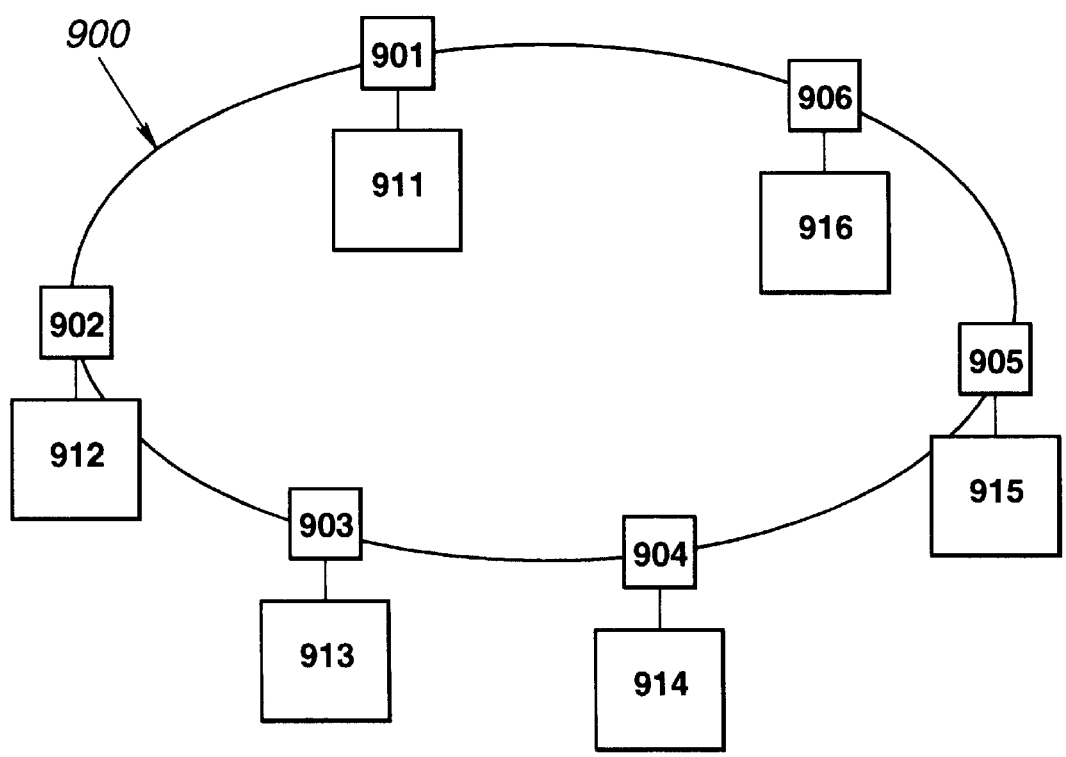
FIG. 17 is a schematic block diagram illustrating the structure of a loop-type optical LAN system using a polarization-mode selective semiconductor laser of the present invention.

In the bus-type network shown in FIG. 16, multiple terminals 811, 812, . . . , and 815 are respectively connected to an optical fiber 800 through nodes 801, 802, . . . , and 805 along a direction A-B. At some places on the optical fiber 800, optical amplifiers (not shown) are serially connected to compensate for attenuation of the transmitted signal light.

In FIG. 15, a light signal is taken into the node 801 through the optical fiber 800, and a portion of the signal is input into an optical receiver 703 by a divider or branching device 702. The optical receiver 703 includes a tunable optical filter and a photodetector, and only signal light at a desired wavelength is taken out from the incident signal light, and the signal is detected. The thus-detected signal is processed by a control circuit 708 to be supplied to a terminal.

On the other hand, when a light signal is transmitted from the node 801, signal light from a light source apparatus or tunable polarization-mode selective DFB semiconductor laser 704 is input into the optical fiber 800 at a combiner 706 through a polarizer 707 (an isolator may also be inserted). The DFB semiconductor laser 704 is appropriately driven by a control circuit 709 according to a signal to be transmitted. The polarization-modulated output from the DFB semiconductor laser 704 is converted to an amplitude-modulated signal by the polarizer 707.

A plurality of tunable optical filters and tunable DFB lasers may be arranged in a node to widen the wavelength changeable range. Further, two nodes may be connected to each terminal and two optical fibers may be provided to accomplish bi-directional transmission of a DQDB system.

In such an optical network system, when the optical communication system of the present invention is used, a high-density wavelength or optical frequency division multiplexing network can be constructed.

As a network, a loop type (see FIG. 17), which is constructed by connecting A and B in FIG. 16, a star type, or a compound configuration thereof may be used. In FIG. 17, reference numeral 900 denotes a light transmission line, reference numerals 901 to 906 respectively denote optical nodes and reference numerals 911 to 916 respectively denote terminals.

Except as otherwise disclosed herein, the various components shown in outline or block form in any of the FIGS. 1–17 are individually well known in the optical semiconductor device, semiconductor-device driving method and therefor and optical communication arts, and their internal construction and operation are not described herein.

While the present invention has been described with respect to what are presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. A polarization-mode selective semiconductor laser for selectively emitting light in either of first and second different polarization modes, said semiconductor laser comprising:

a semiconductor laser structure including an active layer for generating gain spectra for the first and second different polarization modes, said laser structure including a first distributed feedback reflector portion with a first channel stripe and a second distributed feedback reflector portion with a second channel stripe connected to said first stripe channel, said first distributed feedback reflector portion and said second distributed feedback reflector portion being serially arranged in a cavity direction of said semiconductor laser; and a diffraction grating, said diffraction grating being formed with a substantially uniform pitch and a substantially uniform grating vector over said first and second distributed feedback reflector portions, wherein said first and second stripe channels are bent relative to each other so as to make the first polarization mode dominant in said first distributed feedback reflector portion and make the second polarization mode dominant in said second distributed feedback reflector portion.

2. A polarization-mode selective semiconductor laser according to claim 1, wherein said active layer comprises a common active layer for both of said first and second distributed feedback reflector portions.

3. A polarization-mode selective semiconductor laser according to claim 1, wherein said first and second channel stripes respectively extend in the cavity direction forming different angles relative to the grating vector of said diffraction grating.

4. A polarization-mode selective semiconductor laser according to claim 1, further comprising a plurality of electrodes for injecting currents into said first and second distributed feedback reflector portions independently of each other.

5. A polarization-mode selective semiconductor laser according to claim 1, wherein said active layer comprises a bulk active layer.

6. A polarization-mode selective semiconductor laser according to claim 1, wherein said active layer comprises a multiple quantum well active layer.

7. A polarization-mode selective semiconductor laser according to claim 6, wherein said active layer comprises a strained superlattice active layer.

8. A polarization-mode selective semiconductor laser according to claim 1, wherein an angle formed between said first channel stripe and the grating vector of said diffraction grating is zero degrees and an angle formed between said second channel stripe and the grating vector of said diffraction grating is a non-zero finite number of degrees.

9. A polarization-mode selective semiconductor laser according to claim 1, wherein said first and second distributed feedback reflector portions respectively have light emission end facets and one of said first and second channel stripes is formed obliquely to the light emission end facet of said distributed feedback reflector portion.

10. A polarization-mode selective semiconductor laser according to claim 1, wherein said first and second distributed feedback reflector portions respectively have light emission end facets and both of said first and second channel stripes are formed obliquely to the respective light emission end facets of said first and second distributed feedback reflector portions.

11. A polarization-mode selective semiconductor laser according to claim 1, wherein said first and second channel stripes are connected to each other with a smoothly and continuously bending waveguide interposed therebetween.

12. A polarization-mode selective semiconductor laser according to claim 1, wherein a phase shift section is provided in said diffraction grating in each of said first and second distributed feedback reflector portions.

13. A polarization-mode selective semiconductor laser according to claim 1, wherein said diffraction grating comprises a diffraction grating of a refractive index-coupling type.

14. A polarization-mode selective semiconductor laser according to claim 1, wherein said diffraction grating comprises a diffraction grating of a gain-coupling type or a loss-coupling type.

15. A light source apparatus comprising:
   a polarization-mode selective semiconductor laser, said semiconductor laser emitting light in a first polarization mode under a first stimulated condition and light in a second polarization mode under a second stimulated condition and including:
      a semiconductor laser structure including an active layer for generating gain spectra for the first and second different polarization modes, said laser structure including a first distributed feedback reflector portion with a first channel stripe and a second distributed feedback reflector portion with a second channel stripe connected to said first stripe channel, said first distributed feedback reflector portion and said second distributed feedback reflector portion being serially arranged in a cavity direction of said semiconductor laser; and
      a diffraction grating, said diffraction grating being formed with a substantially uniform pitch and a substantially uniform grating vector over said first and second distributed feedback reflector portions,
      wherein said first and second stripe channels are bent relative to each other so as to make the first polarization mode dominant in said first distributed feedback reflector portion and make the second polarization mode dominant in said second distributed feedback reflector portion; and
   polarization-mode selecting means for selecting light in one of the first and second polarization modes emitted from said semiconductor laser.

16. A light source apparatus according to claim 15, further comprising control means for controlling and driving said semiconductor laser such that the polarization mode of the light emitted from said semiconductor laser is changed in accordance with a signal input into said semiconductor laser, and wherein said light source apparatus is constructed as an optical transmitter.

17. A light source apparatus according to claim 16, further comprising receiving means for receiving a signal, and wherein said light source apparatus is constructed as an optical transceiver.

18. An optical communication system for communicating over a light transmission medium that transmits a signal from a transmitter side to a receiver side, said optical communication system comprising:
   a transmitter, said transmitter including:
      a polarization-mode selective semiconductor laser, said semiconductor laser emitting light in a first polarization mode under a first stimulated condition and light in a second polarization mode under a second stimulated condition and including:
         a semiconductor laser structure including an active layer for generating gain spectra for the first and second different polarization modes, said laser structure including a first distributed feedback reflector portion with a first channel stripe and a second distributed feedback reflector portion with a second channel stripe connected to said first stripe channel, said first distributed feedback reflector portion and said second distributed feedback reflector portion being serially arranged in a cavity direction of said semiconductor laser; and
         a diffraction grating, said diffraction grating being formed with a substantially uniform pitch and a substantially uniform grating vector over said first and second distributed feedback reflector portions,
         wherein said first and second stripe channels are bent relative to each other so as to make the first polarization mode dominant in said first distributed feedback reflector portion and make the second polarization mode dominant in said second distributed feedback reflector portion;
      polarization-mode selecting means for selecting one of light in the first and second polarization modes emitted from said semiconductor laser; and
      control means for controlling and driving said semiconductor laser such that the polarization mode of the light emitted from said semiconductor laser is changed in accordance with a signal input into said semiconductor laser; and
   a receiver for receiving a signal from said transmitter.

19. An optical communication system according to claim 18, wherein said transmitter is constructed such that optical signals at a plurality of wavelengths can be transmitted therefrom, and a wavelength division multiplexing network is constructed.

20. An optical communication method for communicating over a light transmission medium that transmits a signal from a transmitter side to a receiver side, said optical communication method comprising the steps of:
   preparing a transmitter, the transmitter including:
      a polarization-mode selective semiconductor laser, the semiconductor laser emitting light in a first polarization mode under a first stimulated condition and light in a second polarization mode under a second stimulated condition and including:
         a semiconductor laser structure including an active layer for generating gain spectra for the first and second different polarization modes, the laser structure including a first distributed feedback reflector portion with a first channel stripe and a second distributed feedback reflector portion with a second channel stripe connected to the first stripe channel, the first distributed feedback reflector portion and the second distributed feedback reflector portion being serially arranged in a cavity direction of the semiconductor laser; and
         a diffraction grating, the diffraction grating being formed with a substantially uniform pitch and a substantially uniform grating vector over the first and second distributed feedback reflector portions,
         wherein the first and second stripe channels are bent relative to each other so as to make the first polarization mode dominant in the first distributed feedback reflector portion and make the second polarization mode dominant in the second distributed feedback reflector portion;
      polarization-mode selecting means for selecting light in one of the first and second polarization modes emitted from the semiconductor laser; and
      control means for controlling and driving the semiconductor laser such that the polarization mode of the light emitted from the semiconductor laser is changed in accordance with a signal input into the semiconductor laser;
   causing the transmitter to transmit an optical signal whose amplitude is modulated in accordance with the signal input into the semiconductor laser; and
   transmitting the optical signal through the light transmission medium toward the receiver side.

* * * * *

UNITED STATES PATENT AND TRADEMARK OFFICE
CERTIFICATE OF CORRECTION

PATENT NO.   : 6,008,675
DATED        : December 28, 1999
INVENTOR(S)  : YUICHI HANDA It is certified that error appears in the above-identified patent and that said Letters Patent is hereby corrected as shown below:

ON THE TITLE PAGE AT [56]
    References Cited, *Primary Examiner*, "Sanghav" should read --Sanghavi--.

ON THE TITLE PAGE AT [57]
    ABSTRACT, line 10, "is" should read --are--.

Figure 2A:
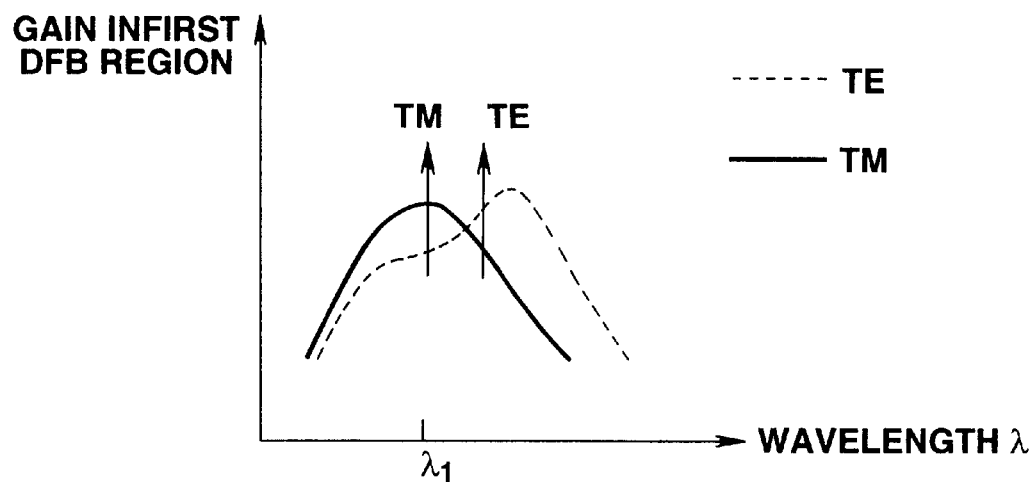
FIG. 2A is a graph illustrating the relationship between gain spectra or profiles and Bragg wavelengths for the TM mode and the TE mode in a first distributed feedback reflector region for explaining the fundamental operation principle of the present invention.
Figure 2B:
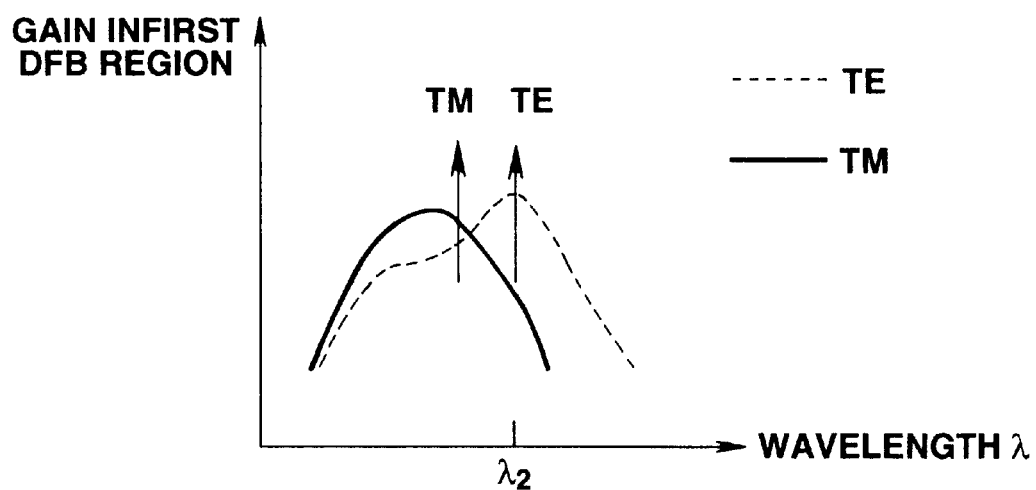
FIG. 2B is a graph illustrating the relationship between gain spectra or profiles and Bragg wavelengths for the TM mode and the TE mode in a second distributed feedback reflector region for explaining the fundamental operation principle of the present invention.

SHEET 2
    Fig. 2A and Fig. 2B should be replaced with attached Fig. 2A and Fig. 2B.

SHEET 3
    Fig. 3 and Fig. 4 should be replaced with attached Fig. 3 and Fig. 4.

SHEET 4
    Fig. 5A and Fig. 5B should be replaced with attached Fig. 5A and Fig. 5B.

SHEET 6
    Fig. 8A and Fig. 8B should be replaced with attached Fig. 8A and Fig. 8B.

COLUMN 2
    Line 63, "oscillat" should read --oscillate--.

COLUMN 3
    Line 52, "on" should read --or--.

COLUMN 4
    Line 19, "one of" should be deleted;
    Line 33, "the either" should read --either the--.

UNITED STATES PATENT AND TRADEMARK OFFICE
CERTIFICATE OF CORRECTION

PATENT NO. : 6,008,675

DATED : December 28, 1999

INVENTOR(S) : YUICHI HANDA

It is certified that error appears in the above-identified patent and that said Letters Patent is hereby corrected as shown below:

COLUMN 5
    Line 42, "K," should read --$K_1$--.

COLUMN 6
    Line 10 "polarizations" should read --polarization--;
    Line 26, "correspond" should read --corresponds--.

COLUMN 7
    Line 9, "poitns" should read --points--.

COLUMN 8
    Line 13, "of" should be deleted;
    Line 23, "pitch $\Lambda$," should read --pitch $\Lambda_1$--.

COLUMN 9
    Line 5, "$\Lambda$hd1" should read --$\Lambda_1$--;
    Line 10, "i" should be deleted;
    Line 35, "poralization" should read --polarization--;
    Line 39, "current 12" should read --current $I_2$--;
    Line 41, "FIG. 6" should read --FIG. 6,--.

COLUMN 10
    Line 4, "($SiO_2$)" should read --($SiO_2$)--.

UNITED STATES PATENT AND TRADEMARK OFFICE
CERTIFICATE OF CORRECTION

PATENT NO. : 6,008, 675
DATED : December 28, 1999
INVENTOR(S) : YUICHI HANDA It is certified that error appears in the above-identified patent and that said Letters Patent is hereby corrected as shown below:

<u>COLUMN 11</u>
    Line 53, "firts" should read --first--;
    Line 61, "ech" should read --each--.

<u>COLUMN 13</u>
    Line 54, "therefor and" should be deleted.

<u>COLUMN 16</u>
    Line 8, "one of" should be deleted;
    Line 9, "in the" should read --in one of the --.

Signed and Sealed this

Seventeenth Day of April, 2001

*Attest:*

NICHOLAS P. GODICI

*Attesting Officer*      *Acting Director of the United States Patent and Trademark Office*